United States Patent [19]
Grace

[11] Patent Number: 5,642,067
[45] Date of Patent: Jun. 24, 1997

[54] VARIABLE SLEW RATE PULSE GENERATOR

[76] Inventor: James W. Grace, 13355 La Cresta Dr., Los Altos Hills, Calif. 94022

[21] Appl. No.: 507,185

[22] Filed: Jul. 26, 1995

[51] Int. Cl.[6] .................................................. H03K 4/94
[52] U.S. Cl. ........................... 327/134; 327/130; 327/133
[58] Field of Search .............................. 327/130, 133–4

[56] References Cited

U.S. PATENT DOCUMENTS

| | | | |
|---|---|---|---|
| 3,402,353 | 9/1968 | Hubbs | 327/130 |
| 4,591,796 | 5/1986 | Mulla-Girard et al. | 327/134 |
| 4,645,946 | 2/1987 | Ishikawa et al. | 327/130 |
| 5,025,172 | 6/1991 | Carroll et al. | 327/130 |
| 5,140,591 | 8/1992 | Palara et al. | 327/130 |

*Primary Examiner*—Margaret Rose Wambach

[57] ABSTRACT

An integrated circuit pulse generator for per pin testing of electronic circuits. The pulse generator allows for independent adjustment of the slew rates of the rising and falling edges of the pulses. The pulse edges are generated by summing two separately controlled falling edge ramp generators. The circuit design of the pulse generator is structured to allow implementation with NPN transistors. The falling edge ramp generators operate by discharging a capacitor with a current source. The slew rates are varied by incrementally adding capacitance to the capacitor being discharged.

16 Claims, 14 Drawing Sheets

VARIABLE SLEW RATE PULSE GENERATOR

FIELD OF INVENTION

This invention relates generally to electronic circuits for generating pulsed waveforms and, more particularly, to electronic circuits for generating variable slew rate high speed pulsed waveforms which allow per pin testing of integrated circuits.

BACKGROUND

Many electronic circuits require a pulsed waveform during operational use. Other electronic circuits require a pulsed waveform to fully characterize and test their performance. These electronic circuits typically need a pulse generator which is variable in frequency, pulse height and pulse inversion. The slew rates of the rising and falling edges should be independently adjustable. In addition, pulse generators (driver circuits) for automatic test equipment (ATE) need to be small so that a large number of pulse generators may be located at a test head near a device under test (DUT).

A conventional pulse generator comprising a ramp circuit with variable slew rate control and a buffer is shown in the circuit schematic in FIG. 1. The variable rise and fall slew rates are obtained by alternating the charging and discharging of a capacitor 102 with a first variable current generator 104 and a second variable current generator 106. The charging and discharging operation is accomplished by opening and closing a first switch 108 and a second switch 110. The opening and closing of the switches 108, 110 is synchronized with a clock signal. The voltage on a ramp node 114 represents the voltage across the capacitor. A buffer 112 has an output 124 which replicates the voltage on the ramp node 114 for a variety of load conditions on the output 124.

V-lo 116 is a voltage supply which is connected to a first clamp diode 120 to clamp the ramp node 114 from going more than one diode voltage drop below V-lo 116. Similarly, V-hi 118 is a voltage supply which is connected to a second clamp diode 122 to clamp the ramp node 114 from going higher than one diode voltage drop above V-hi 118. By controlling both V-lo 116 and V-hi 118, the ramp node 114 voltage and consequently the output 124 of the buffer 112 can be contained within a predetermined range of voltages.

The value chosen for the capacitor 102, the current IB of the first current generator 104 and the current IA of the second current generator 106 control the rise and fall times of the pulsed output signal. In this circuit configuration, the second current generator 106 controls the rise slew rate and the first current generator 104 controls the fall slew rate. The second current generator 106 is a source of current because current from the generator 106 flows into the capacitor 102 and the first current source 104 is a sink of current because current from the generator 104 flows out of the capacitor 102.

The sequence of operation may be described as follows. When the clock signal is in a first state, the first switch 108 is closed and the second switch 110 is opened. The capacitor 102 will discharge to the point that the ramp node 114 is one diode voltage drop below V-lo 116. When the clock signal transitions to a second state, the second switch 110 is closed and the first switch 108 is opened simultaneously. Sink current of the first current source 104 is interrupted and the source current of the second current source 106 is applied to the ramp node 114. The ramp capacitor 102 will charge up until the voltage on the ramp node 114 is clamped by the second diode 122 turning on. This will occur when the voltage at the ramp node 114 is one diode voltage drop above V-hi 118. The rising slew rate of the ramp node 114 is proportional to the source current IA of the second current source 106 applied and inversely proportional to the capacitance on the ramp node 114. Similarly, when the settings of the switches are reversed, the falling slew rate is proportional to the sink current IB of the first current source 104 applied and inversely proportional to the capacitance on the ramp node 114.

It is desirable to have the slew rates be constant during the rising and falling of a voltage pulse. This requires that the source and sink currents provide a constant current flow into or out of the ramp node 114. The source and sink currents may be of different magnitudes so that the rise slew rate and fall slew rate are different. This allows for a fast rise time and a slow fall time pulse or a slow rise time and a fast fall time pulse.

When the voltage at the ramp node 114 has ramped up to or down to its final voltage, the capacitor 102 is no longer being charged. The current IA or IB will flow through either the first diode 120 or the second diode 122 exclusively. The current IA of the second current source 106 and the current IB of the first current source 104 are variable. The voltage across a diode is slightly dependent on the current flowing through it. Therefore, the voltage across the first diode 120 or the second diode 122 is also variable. As a result, the accuracy of the voltage at the ramp node 114 can be poor. In addition, the diodes are temperature sensitive which can cream errors over any temperature operating range.

Most pulse generators require linear slew rates which requires constant charging currents for the first current source 104 and the second current source 106. For the second current source 106, current is being sourced to a ramp node 114 rather than taken from the ramp node 114. When implemented on an integrated circuit, this generally implies the use of PNP transistors and the switching of such transistors is slow. In addition, the second switch 110 and possibly the second current source 106 add extra capacitance to the ramp node 114. This extra capacitance slows the speed of operation considerably and limits the maximum slew rate possible.

FIG. 2A shows the control signal to the second switch 110. FIG. 2B shows the control signal to the first switch 108. FIG. 2C shows the output signal of the buffer 112. The time T1 at which the second switch is closed and the first switch is opened defines the beginning of rising edge 125 of the output signal 2C. The time T2 at which the second switch is opened and the first switch is closed defines the beginning of the falling edge of the output signal 2C.

For electronic circuit operation and test, there is a need for a pulse generator with adjustment capabilities of the slew rates of the rising and falling edges and variability in the waveform frequency, pulse height, pulse inversion. The pulse waveform parameters should be accurate and not vary with temperature. In addition, it is desirable that the pulse generator be physically small so that a large number of pulse generators may be located at a test head near a device under test (DUT).

SUMMARY OF THE INVENTION

This invention resides in a pulse generator which is variable in output signal frequency, pulse height, and pulse inversion, and which allows adjustment of the pulse rise and fall times. The novel circuit architecture of the invention provides high output signal frequencies (1 GHz) and provides pulses with extremely fast rise and fall times. The pulse waveform parameters are accurate and resistant to variations in temperature. This invention can be implemented on a single monolithic circuit which requires minimal space in its operation. In addition to the monolithic circuit, only a few components are required. These additional components include bypass capacitors, terminating resistors and an external NPN transistor for obtaining high voltage pulses.

A variable slew rate pulse generator according to this invention comprises a clock source which generates a clock signal having a first state and a second state. When the clock signal is in the first state, a first ramp generator generates a first ramp signal which ramps down at a first slew rate from a voltage level of V-hi to a voltage level of V-lo. When the clock signal is in the second state, a second ramp generator generates a second ramp signal which ramps down at a second slew rate from a voltage level V-hi to a voltage level of V-lo. A vernier amplifier switch receives the first ramp signal and the second ramp signal The vernier amplifier switch generates an output signal having an amplitude and an offset. The output signal is an inverted function of the first ramp signal when the clock signal is in the first state and the output signal is a function of the second ramp signal when the clock signal is in the second state. The vernier amplifier switch includes a reference input for adjusting and nulling the offset of the output signal, and an amplitude input for adjusting the amplitude of the output signal. The first slew rate is adjustable independently from the second slew rate, and the second slew rate is adjustable independently from the first slew rate.

The first ramp generator and the second ramp generator comprise similar circuit elements. These circuit elements include a ramp capacitor connected between a ground terminal and a node, and a current sink conducting a predetermined amount of current from the node. To charge the ramp capacitor to a predefined high voltage level, the node is coupled to a ramp high voltage source. To discharge the ramp capacitor, the ramp high voltage source is disconnected and the current sink conducts current from the ramp capacitor, discharging the ramp capacitor so that the voltage on the node declines at a determined slew rate. The ramp generator includes clamping circuitry to prevent the node from going below a predetermined voltage. The ramp capacitor of the first ramp generator and the ramp capacitor of the second ramp generator charge and discharge on opposite halves of a clock cycle from each other. That is, on one first half of a clock cycle the capacitor of the first ramp generator charges and the capacitor of the second ramp generator discharges and on the second half of the clock cycle the first ramp generator discharges and the capacitor of the second ramp generator charges.

To prevent the node within the ramp generators from going below a predetermined voltage, a clamping diode can be used. To improve the accuracy of the predetermined voltage, the voltage clamping can be accomplished through the use of two clamping diodes.

To charge the ramp capacitor to the predefined high voltage level, the node is coupled to a ramp high voltage source. A circuit for coupling the node to the ramp high voltage source can include two matched diodes which when forward biased drive the node to a voltage substantially equal to the ramp high voltage source.

Another aspect of this invention is to allow the slew rates to be variable. A circuit that provides this function may switch a charged range capacitor to be connected in parallel with the first ramp capacitor.

Other aspects and advantages of the present invention will become apparent from the following detailed description, taken in conjunction with the accompanying drawings, illustrated by way of example the principles of the invention.

DETAILED DESCRIPTION

Figure 1:
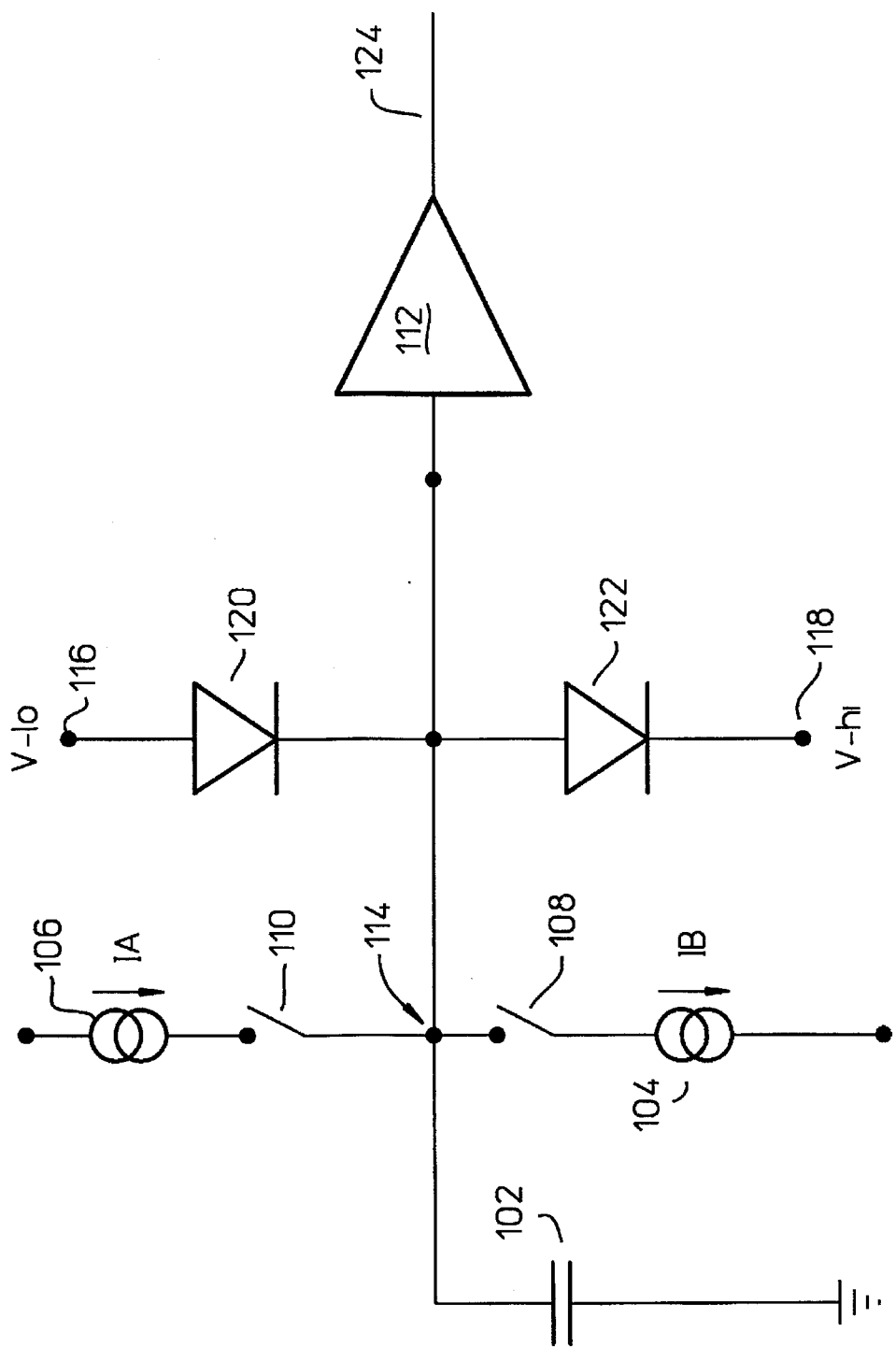
FIG. 1 is a circuit schematic of a conventional ramp generator and buffer according to the prior art.
Figure 2:
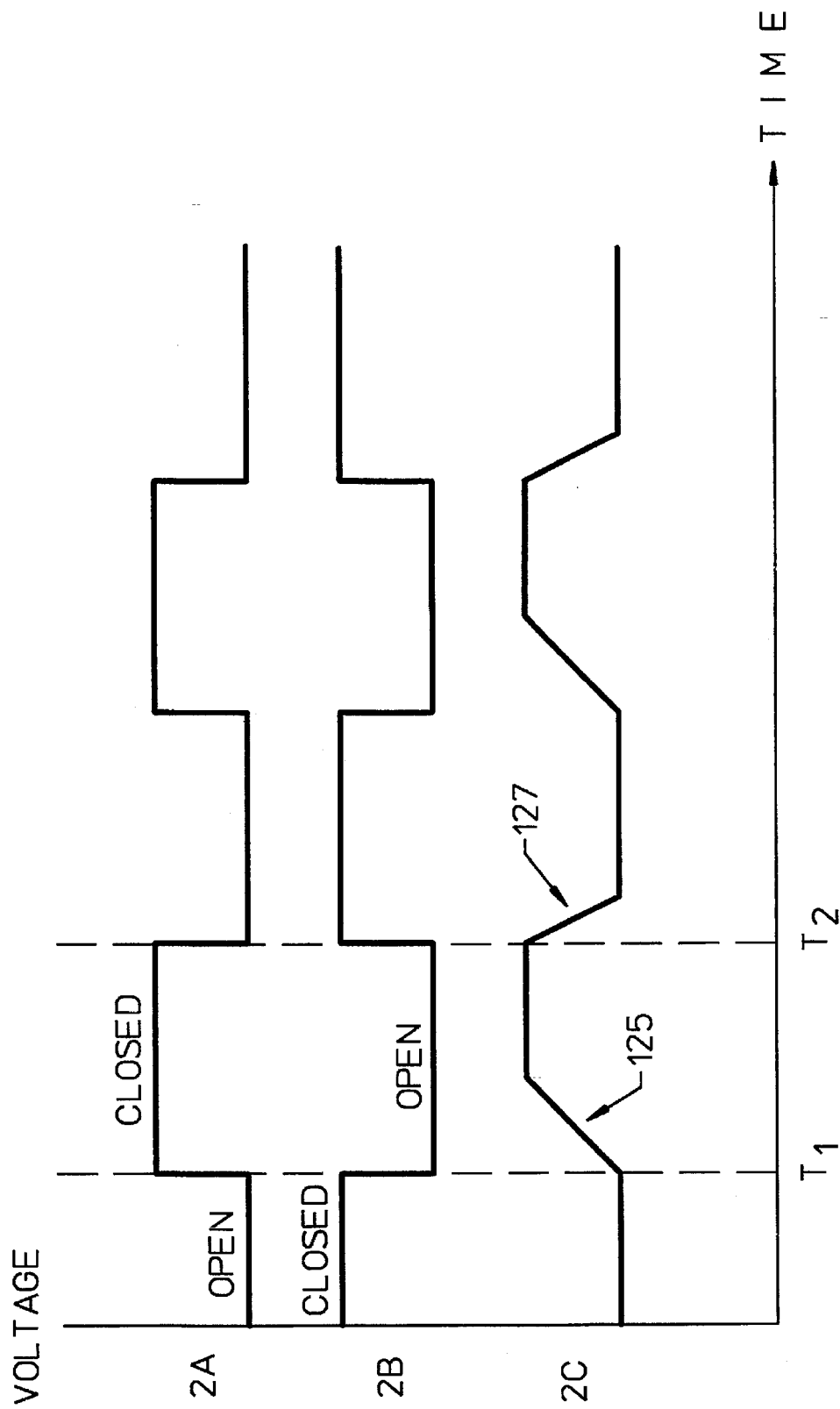
FIG. 2 is timing diagrams of the conventional ramp generator and buffer depicted in FIG. 1.

As shown in the drawings for purposes of illustration, the invention is embodied in a variable slew rate electronic pulse generation device and method. The invention provides an electronic circuit architecture that allows for the generation of very high frequency variable slew rate pulsed waveforms. The circuit architecture uses NPN transistors rather than PNP transistors thereby obtaining high frequency operation up to 1 GHz. The circuit architecture also provides very low capacitive loading of critical circuit elements. The low capacitive loading allows for the generation of pulses with very fast slew rates.

In accordance with the invention, rising and falling edges of pulses are generated by discharging two separate capacitors. The waveforms provided by the two separate discharging capacitors are combined to form pulses with rise and fall slew rates which are independently adjustable. This architecture further enables the incorporation of novel circuitry that allows the capacitance of the discharge capacitors to be incremented without adding a substantial amount of residual capacitance. As a result, the minimum value of capacitance of the discharge capacitors is not greatly affected by parasitic circuit capacitance of the additional circuitry added to allow for incrementing of the capacitance of discharge capacitors. Therefore, extremely fast slew rates can be generated. Additional novel circuitry provides for precise control over the upper and lower voltage levels of the pulsed waveforms. The circuitry of the invention can be located on a single integrated circuit making it physically small. Therefore, several generators embodying the invention can provide signals for testing several individual pins of an electronic integrated circuit under test.

Figure 3:
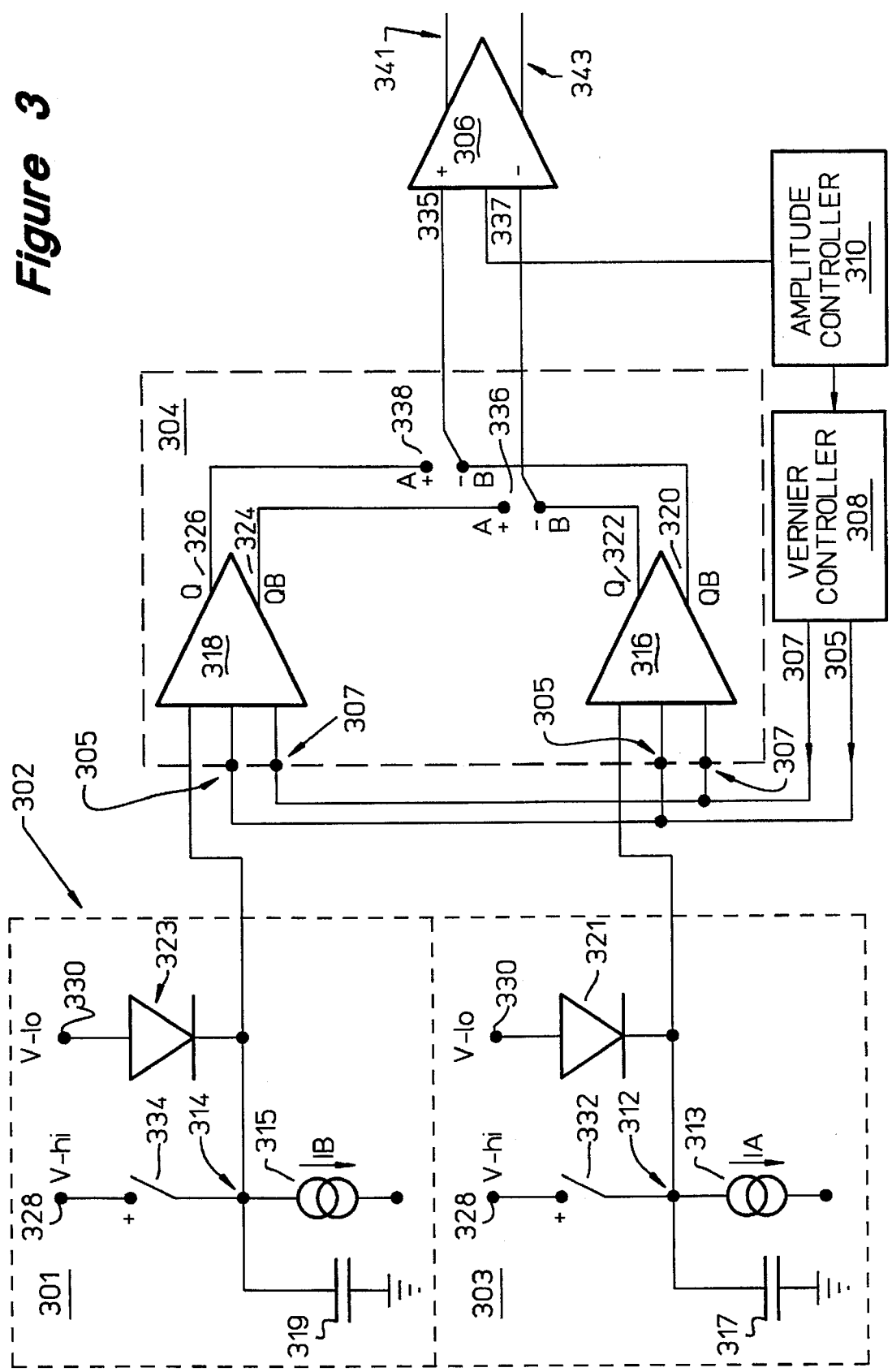
FIG. 3 is a circuit schematic generally depicting a first embodiment of the invention.

A basic embodiment of this invention is shown in FIG. 3. The basic embodiment consists of a ramp generator section 302, a vernier amplifier switch 304, a drive buffer 306, a vernier controller 308 and an amplitude controller 310.

The ramp generator section 302 comprises a first ramp generator 303 and a second ramp generator 301 which produce two failing slew rate con triggered by a clock signal. One of the falling edge signals begins on the rising edge of the clock and the other falling edge signal begins on the failing edge of the clock.

The vernier amplifier switch 304 comprises a first buffer 316 and a second buffer 318. The vernier amplifier switch 304 receives the two falling edge signals. One of the failing edge signals is inverted in the vernier amplifier switch 304 and creates the slew rate controlled rising edge of the generated pulse. The other falling edge signal is not inverted in the vernier amplifier switch 304 and creates the slew rate controlled falling edge of the generated pulse signal. The vernier amplifier switch 304 also has a reference input 307 and an amplitude input 305 received from the vernier controller 308 for adjusting the amplitude and offset of the generated pulse signal. The amplitude controller 310 provides input to the vernier controller 308 to help control the amplitude input 305.

The drive buffer 306 receives a differential pulse waveform generated in the vernier amplifier switch 304 and amplifies the pulse signal to the desired amplitude. The drive buffer 306 is basically an emitter degenerated differential transistor pair (not shown) providing a current output. The collectors of these transistors are connected to terminating resistors (50 ohms) which provide desirable generator impedance characteristics. For high voltage operation, external cascode stages (transistors) can easily be accommodated between drive buffer 306 and the terminating resistors.

The first ramp generator 303 includes a first ramp capacitor 317 connected between ground and a first ramp node 312. A cathode of a first ramp diode 321 is connected to the first ramp node 312. An anode of the first ramp diode 321 is connected to a low voltage reference source (not shown) at a connection point 330. A first ramp switch 332 is connected between the first ramp node 312 and a high voltage reference source (not shown) at a connection point 328. A first current sink 313 is connected to the first ramp node 312 so as to draw current from the first ramp node 312.

In operation, the first ramp switch 332 (which in practice may be a switching transistor or some other suitable solid-state element) is open during the first half of a clock cycle and is closed during the second half of the clock cycle. During the second half of the clock cycle, the high voltage reference source charges the first ramp capacitor 317. During the first half of the clock cycle, the first ramp capacitor 317 discharges through the first current source 313 until the voltage at the first ramp node 312 goes low enough to forward-bias the first ramp diode 321. At that point, the first ramp capacitor 317 stops discharging because the first current source 313 draws current from the low voltage reference source at connection point 330, and the voltage across the first ramp node 312 stays constant until the second half of the clock cycle begins again.

Similarly, the second ramp generator 301 includes a second ramp capacitor 319 connected between ground and a second ramp node 314. A cathode of a second ramp diode 323 is connected to the second ramp node 314. An anode of the second ramp diode 323 is connected to the low voltage reference source at the connection point 330. A second ramp switch 334 is connected between the second ramp node 314 and the high voltage reference source at the connection point 328. A second current sink 315 is connected to the second ramp node 314 so as to draw current from the second ramp node 314. The functioning of the second ramp generator 301 is similar to the functioning of the first ramp generator 303 except that the second ramp switch 334 is closed during the first half of the clock cycle rather than during the second half.

The result is that during the first half of the clock cycle, the circuitry generates a well controlled first falling edge on the first ramp node 312, and during the second half of the clock cycle, the circuitry generates a well controlled second falling edge on the second ramp node 314. This circuit scheme is called a dual sink current design.

The first buffer 316 is a single input buffer that operates against the reference input 307 provided by the vernier controller 308. The first buffer 316 generates a differential output 320, 322, with an adjustable magnitude controlled by the amplitude controller 310 and vernier controller 308. Slew rate controlled pulses representing the slew rate pulses generated on the first ramp node 312 are at the output of first buffer 316. The differential outputs 320 and 322 of the first buffer 316 are connected by a first buffer switch 336 and a second buffer switch 338 to a differential input 337 and differential input 335 of the drive buffer 306.

The second buffer 318 is a single input buffer that also operates against the reference input 307 provided by the vernier controller 308. The second buffer 318 generates a differential output 324, 326, with an adjustable magnitude controlled by the amplitude controller 310 and vernier controller 308. The slew rate controlled pulses generated on the second ramp node 314 are maintained at the output of second buffer 318. The differential outputs 324 and 326 of the second buffer 318 are connected by the first buffer switch 336 and the second buffer switch 338 to the differential input 335 and the differential input 337 of the drive buffer 306.

The drive buffer 306 has differential outputs 341 and 343. The first buffer switch 336 and the second buffer switch 338 connect the drive buffer 306 to the first buffer 316 when the clock signal is in the first half of a clock cycle, and connect the drive buffer 306 to the second buffer 318 when the clock signal is in the second half of a clock cycle. The first buffer 316 is connected to the drive buffer 306 in such a manner that the pulse waveform at the output of the first buffer 316 is inverted at the drive buffer 306 output. The second buffer 318 is connected to the drive buffer 306 so that the pulse waveform at the output of the second buffer 318 is non-inverted. When the buffer switches 336 and 338 change states, the first differential output 322 of the first buffer 316 is at the same potential as the second differential output 324 of the second buffer 318, and the second differential output 320 of the first buffer 316 is at the same potential as the first differential output 326 of the second buffer 318. Therefore, when the first ramp switch 336 and the second ramp switch 338 simultaneously change states, transients of the pulse generator are minimized.

The pulse generator slew rate controlled rising edge begins when the first ramp switch 332 is opened and the second ramp switch 334 is closed simultaneously. The first ramp node 312 starts at the voltage potential of the high reference voltage at connection point 328, and decreases in voltage as the first current sink 313 pulls charge off of the first ramp capacitor 317. Therefore, the slew rate is set by the value of the first ramp capacitor 317, and by the amount of current the first ramp current sink 313 draws from the first ramp node 312. The first buffer switch 336 and the second buffer switch 338, are set to connect the differential inputs 335, 337 of the drive buffer 306 to the outputs 320, 322 of the first buffer 316. This connection is made so that the first buffer 316 differential outputs 320, 322 are inverted in signal polarity from the pulsed signal at the output of the second buffer 318. As the differential output signal of the first buffer 316 decreases, the differential output signal of drive buffer 306 increases in potential.

The pulse generator slew rate controlled falling edge begins on the next clock edge at which time the second ramp switch 334 is opened. The second ramp node 314 is at a voltage potential of the high voltage reference at connection point 328, and starts to decrease in voltage as the second current sink 315 pulls charge off of the second ramp capacitor 319. Therefore, the slew rate is set by the value of the second ramp capacitor 319 and the amount of current the second current sink 315 draws from the second ramp node 314. The first buffer switch 336 and the second buffer switch 338 connect the inputs of the drive buffer 306 to the differential outputs 324, 326 of the second buffer 318. The connection is such that the second buffer 318 signals are non-inverted at the output of the drive buffer 306. As the differential output signal of the second buffer 318 decreases, the differential output signal of drive buffer 306 also decreases.

Figure 4:
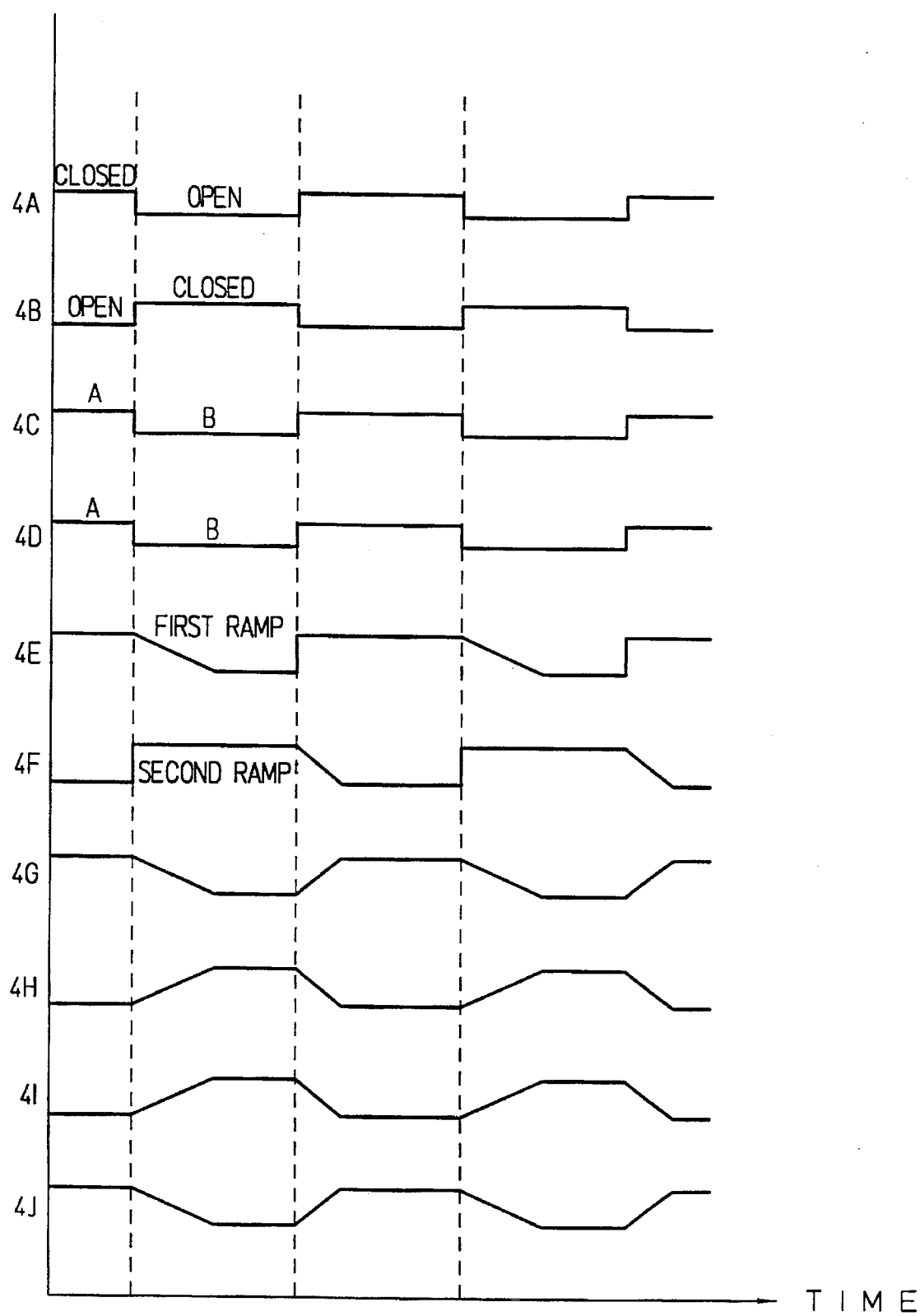
FIG. 4 is timing diagrams of the signals of the circuit shown in FIG. 3.

FIG. 4 shows the control signals for the switches of the embodiment shown in FIG. 3. Trace 4A shows the control signal to the first ramp switch 332 and Trace 4B shows the control signal to the second ramp switch 334. Traces 4C and 4D show the control signals to the first buffer switch 336 and the second buffer switch 338. When the first buffer switch 336 and the second buffer switch 338 are in the A position, the second buffer 318 is connected to the input of the drive buffer 306. When the first buffer switch 336 and the second buffer switch 338 are in the B position, the first buffer 316 is connected to the input of the drive buffer 306. FIG. 4E depicts the voltage waveform on the first ramp node 312. This waveform shows the falling edge generated when the first ramp switch 332 is open. FIG. 4F shows the falling edge generated on the second ramp node 314 voltage waveform when the second ramp switch 334 is opened. FIG. 4G and 4H show the waveforms of the signals at the differential inputs 335, 337 to the drive buffer 306. FIGS. 4I and 4J show the signals at the differential outputs of the drive buffer 306.

Figure 5:
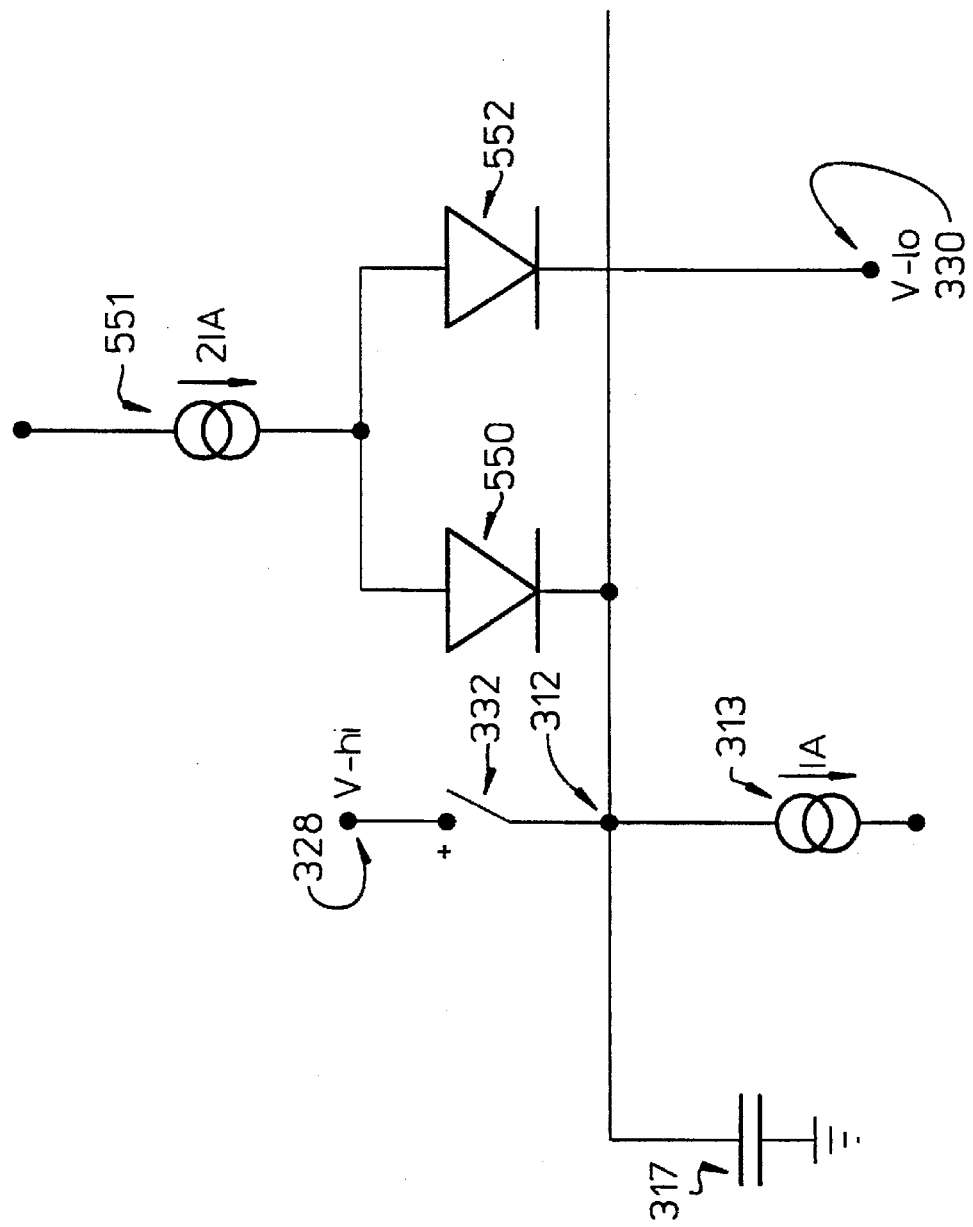
FIG. 5 is a circuit schematic depicting an alternate embodiment of the clamping function of this invention.

An alternate embodiment of the first ramp generator 303 is shown in FIG. 5. This embodiment is similar to that shown in FIG. 3 and for convenience components in FIG. 5 that are similar to components in FIG. 3 are assigned the same reference numerals.

The embodiment of FIG. 5 provides more accurate clamping to the low voltage reference source at connection point 330 by the using extra matching diodes. Variations in the clamping voltage are present in the embodiment of FIG. 3 due to variations in diode current and diode temperature. This embodiment includes replacing the first ramp diode 321 with a first ramp split diode 550 and a second ramp split diode 552. This embodiment further includes adding a split diode current source 551 which is connected to the anodes of the first ramp split diode 550 and the second ramp split diode 552. The split diode current source 551 supplies 2IA (twice the current of the first current sink 313) of current to the first ramp split diode 550 and the second ramp slit diode 552. When the first ramp capacitor 317 has discharged to the point that the first ramp split diode 550 begins to conduct, the amount of current the first ramp split diode 550 will conduct is equivalent to current IA of the first current sink 313 and equal to the amount of current conducted by the second ramp split diode 552. The voltage potentials across the first ramp split diode 550 and the second ramp split diode 552 are matched. Because the first ramp split diode 550 and the second ramp split diode 552 are matched, and because they conduct the same amount of current, the clamp voltage set by the first ramp split diode 550 is more accurately controlled than it was before. This is because the variations in voltage across the first ramp diode 321 of FIG. 3 directly varied the clamp voltage. However, the matched ramp split diode pair 550 and 552 of FIG. 5, operate to cancel out the variations in the voltage across the diodes to more accurately set the clamp voltage. Therefore, the voltage on the first ramp node 312 more accurately replicates the low voltage reference source at connection point 330, when the voltage across the first ramp capacitor 319 ramps down to the point that the first ramp split diode 550 starts to conduct. In the same manner, the second ramp node 314 can more accurately replicate the low voltage reference source at connection point 330, by incorporating the same circuitry to operate in association with the second ramp node 314.

Figure 6:
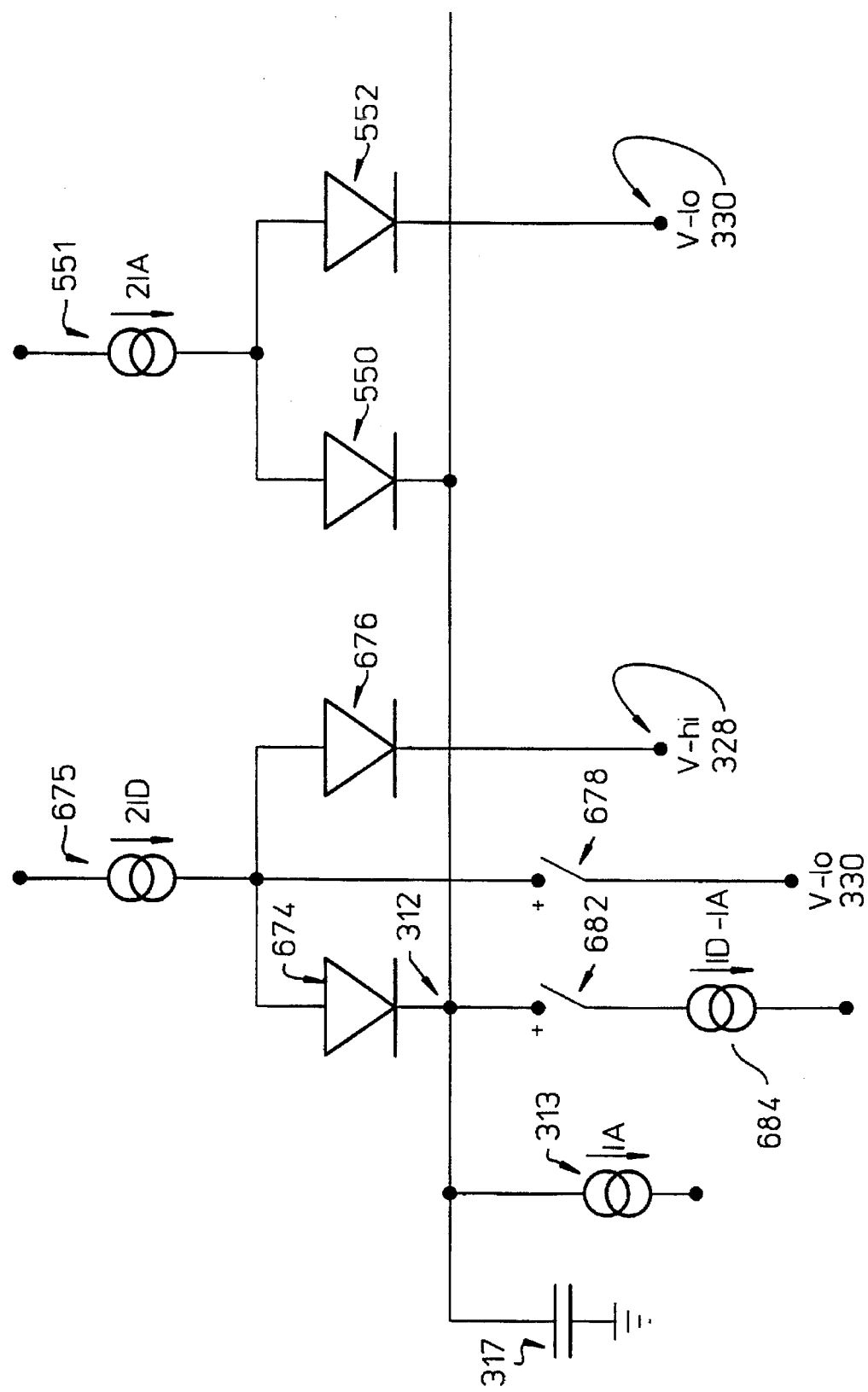
FIG. 6 is a circuit schematic depicting another alternate embodiment of the clamping function of this invention.

A second alternate embodiment of the first ramp generator 303 is shown in FIG. 6. This embodiment is similar to that shown in FIG. 5 and for convenience components in FIG. 6 that are similar to components in FIG. 5 are assigned the same reference numerals.

The embodiment shown in FIG. 6 provides for more accurate clamping of the first ramp node 312 to the high voltage reference source at connection point 328. This embodiment further includes a third ramp diode 674, a fourth ramp diode 676, a first ramp current switch 682, a second ramp current switch 678, a third ramp current sink 684 drawing a current of ID−IA, and a fourth ramp current source 675 providing a current of 2ID. The first ramp switch 332 has been removed to accommodate the additional circuitry. When the first ramp current switch 682 is closed and the second ramp current switch 678 is open, the first ramp node 312 replicates the potential of the high voltage reference source at connection point 328. In this circuit configuration, when the second ramp current switch 678 is open, the current through the third ramp diode 674 and the fourth ramp diode 676 is equal. Therefore, the voltage drop across the third ramp diode 674 and the voltage drop across the fourth ramp diode 676 will also be equal. The current through the third ramp diode 674 is a combination of IA+(ID−IA)=ID. The first ramp split diode 550 is reverse biased and therefore supplies no current to the first ramp node 312.

Figure 7A:
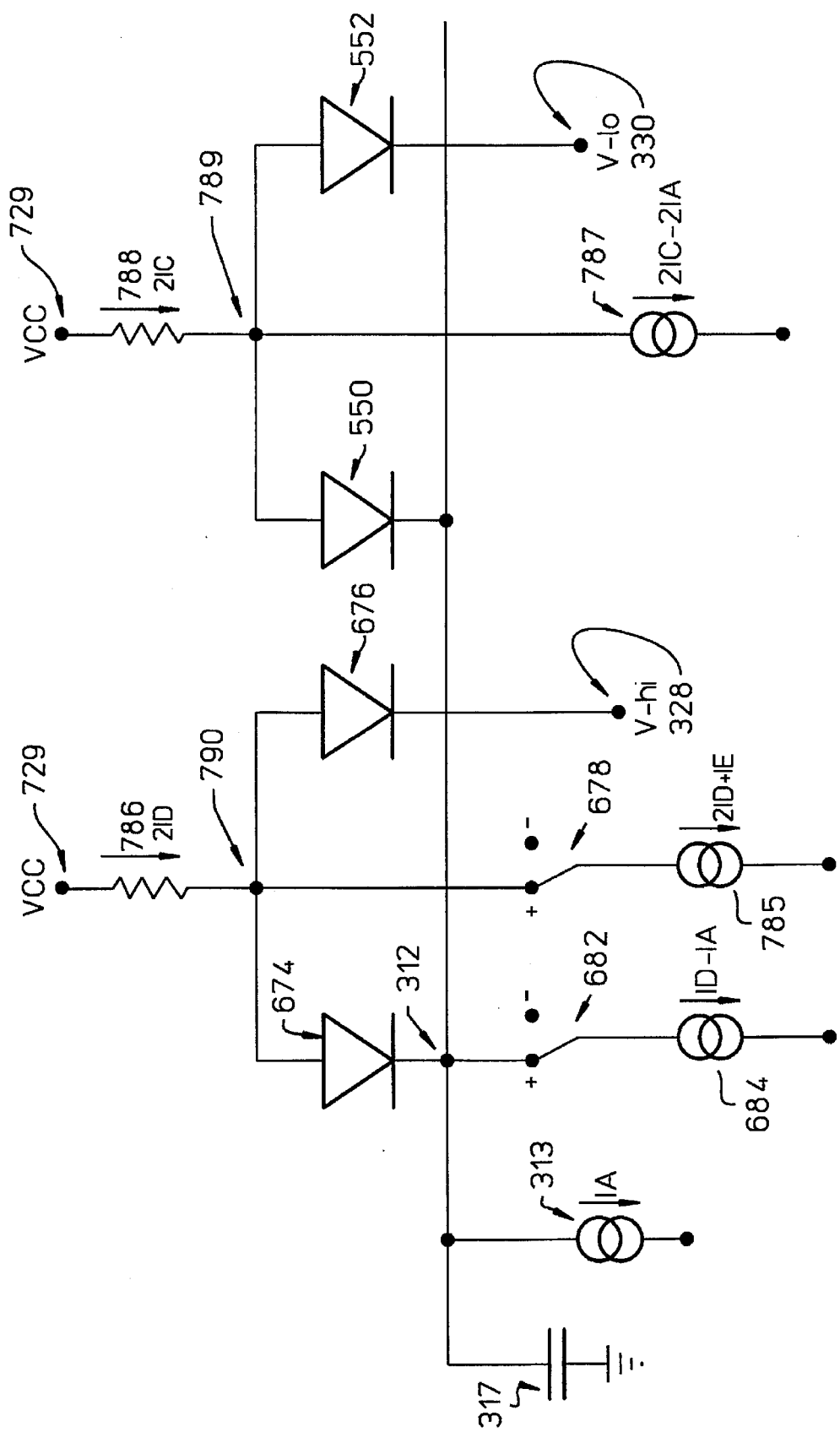
FIG. 7A is another circuit schematic depicting an alternate embodiment of the clamping function of this invention.

A third alternate embodiment of the first ramp generator 303 is shown in FIG. 7A. This embodiment is similar to that shown in FIG. 6 and for convenience components in FIG. 7A that are similar to components in FIG. 6 are assigned the same reference numerals.

Figure 7B:
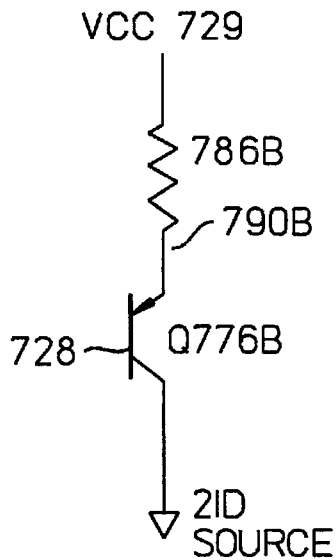
FIGS. 7B and 7C are circuit diagrams of the current source generators of this invention.
Figure 7C:
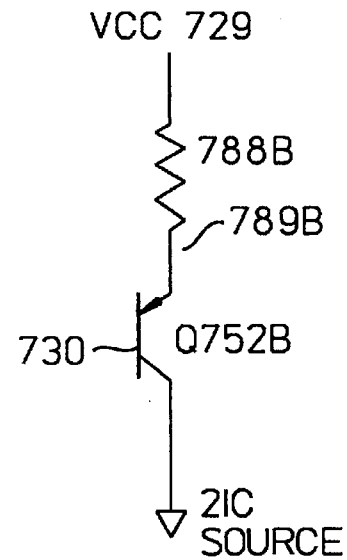
Figure 7D:
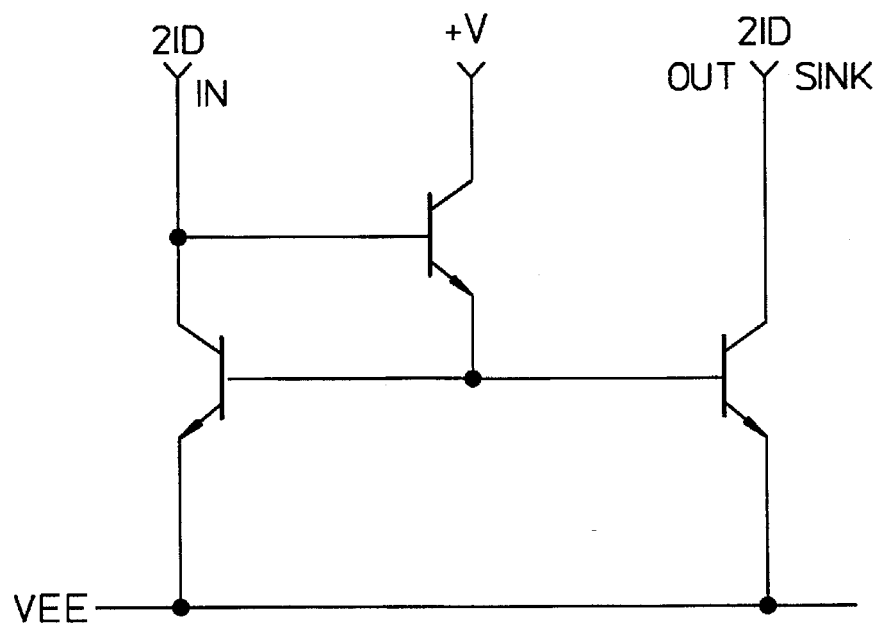
FIG. 7D is a circuit schematic of a current mirror for producing a current sink.

The embodiment shown in FIG. 7A provides another circuit configuration for clamping the first ramp node 312 to the high voltage reference source at the connection point 328. The first ramp current switch 682 and the second ramp current switch 678 are now depicted as 2 pole switches that can be implemented by using differential pairs of NPN transistors (not shown). The split diode current source 551 and the fourth ramp current source 675 have been replaced by a first ramp resistor 786 and a second ramp resistor 788. The ramp resistors 786, 788 are connected to a power supply VCC 729. A first compensation current sink 785, and a second compensation current sink 787 have been added to compensate for current being generated across the first ramp resistor 786 and the current being generated across the second ramp resistor 788. This circuit progression can be understood by analyzing the current source generators shown in FIGS. 7B, 7C and the current mirror shown in FIG. 7D. FIG. 7B depicts a circuit schematic where the functionality of the fourth ramp diode 676 is implemented by using an emitter to base junction of a PNP transistor 776B. FIG. 7C depicts a circuit schematic where the functionality of the second ramp split diode 552 is implemented by using an emitter to base junction of a PNP transistor 752B. The current flowing through the first ramp resistor 786 and the second ramp resistor 788 is replicated by appropriately selecting the values of the resistors 786B, 788B. The emitter base diodes of PNP transistors 776B, 752B have about the same diode drop as the fourth ramp diode 676 and the second ramp split diode 552. Therefore, the potentials across resistors 786B and 786 will be equal and the potentials across the resistors 788B and 788 will be equal. FIG. 7D shows the circuitry for a current mirror that is well known in the art of integrated circuit design. A current mirror like the one depicted can be used to replicate the currents, 2ID and 2IC, across the first ramp resistor 786 and the second ramp resistor 788.

When the clock signal is in the last half of the previous clock cycle, the second ramp current switch 678 is closed and the first ramp current switch 682 is open. The current being sourced to a second clamp node 789 is 2IC–(2IC–2IA)=2IA. The current being sourced to a first clamp node 790 is 2ID. The current being conducted from the first ramp node 312 is IA+(ID–IA)=ID. The current flowing through the third ramp diode 674 and the current flowing through the fourth ramp diode 676 are equal and the first ramp node 312 will be at the voltage potential of the high voltage reference at connection point 328. When the clock signal enters the first half of the clock cycle, the first ramp current switch 678 is opened and the second ramp current switch 682 closes. When the first ramp current switch 678 is closed connecting the first compensation current sink 785 to the first clamp node 790, the potential of the first clamp node 790 is pulled down close to the potential of low voltage reference source at connection point 330, so that the third ramp diode 674 is non-conducting. This is accomplished by setting the current of the first compensation current sink 785 to 2ID plus an extra amount of current IE. The value of IE is equal to the potential [(high voltage reference source–low voltage reference source)+(a diode voltage drop)] divided by the resistance of the first ramp resistor 786. The current being removed from first ramp capacitor 317 is IA until the first ramp node 312 is clamped to the voltage level of the low voltage reference source at connection point 330. The current IA drawn by the first current sink 313 determines the slew rate of first ramp node 312. When the first ramp current switch 682 closes and the second ramp current switch 678 opens the current 2ID quickly resets the first ramp node 312 to the voltage of the high voltage reference source at connection point 328.

The first ramp capacitor 317 and the second ramp capacitor 319 are determined by the designer. However, for very fast slew rates, the first ramp capacitor 317 and the second ramp capacitor 319 should be as small as possible. The ramp capacitors can be constructed to be the parasitic capacitance of the device being used and the interconnecting metal pattern. For slower slew rates, additional capacitance needs to be added to the first ramp node 312 and the second ramp node 314. This is hard to do without affecting the fast slew rates because of additional circuitry needed. The desired circuitry must be able to add a selectable amount of capacitance onto these nodes without adding an appreciable amount of capacitance by the presence of the circuitry.

Figure 8:
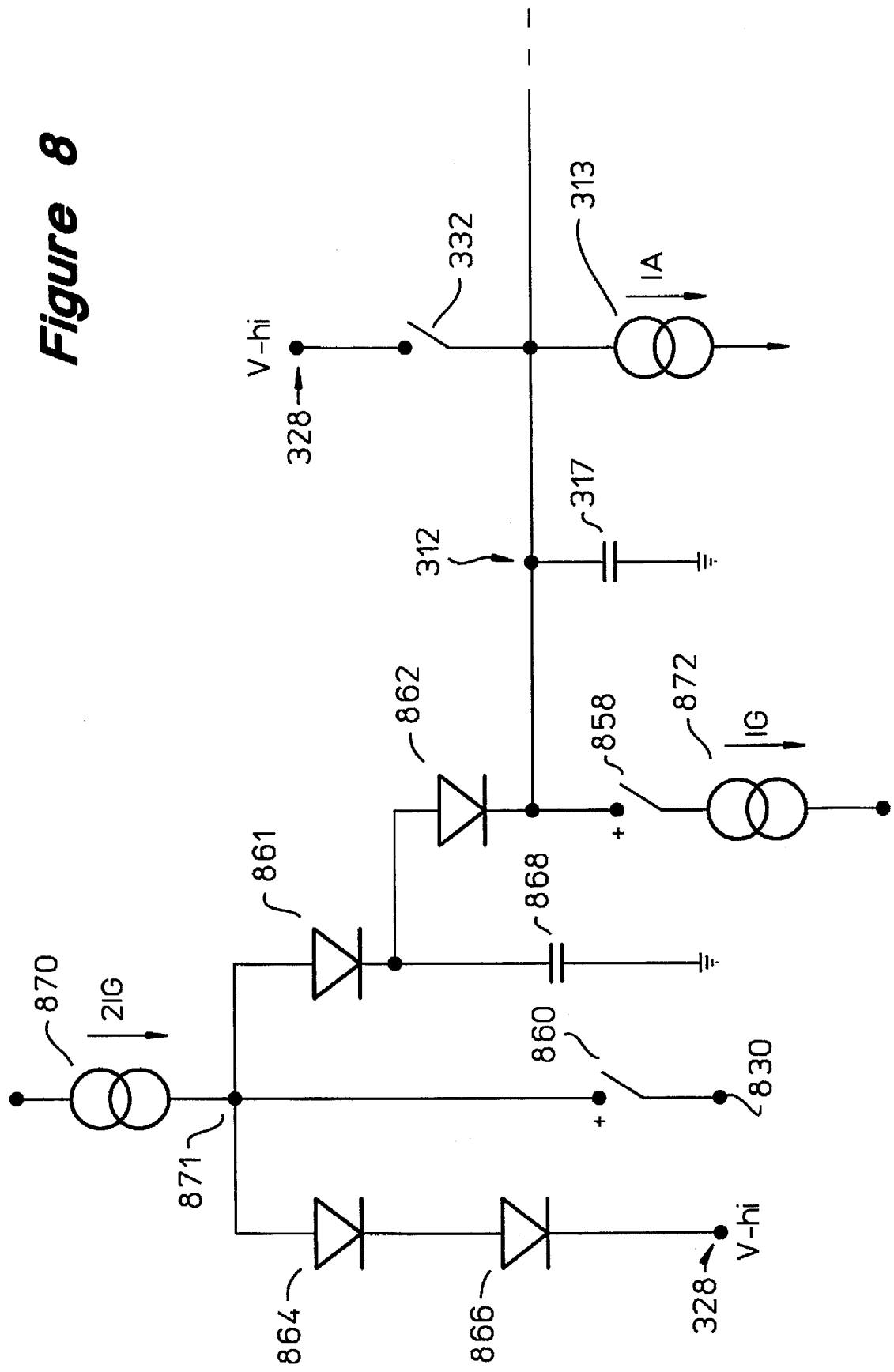
FIG. 8 is a circuit schematic depicting the ramp capacitor range change function of this invention which can be combined with the embodiments shown in FIGS. 3, 5, 6 or 7A.

The dual sink current designs of FIGS. 3, 5, 6, 7 allow for easy attachment of capacitors with a minimum of parasitic capacitive loading. A design for attaching extra capacitance to a ramp node is shown in FIG. 8. This circuit is comprised of an additional capacitor, 4 diodes, a current source, a current sink, and 2 switches. This circuit provides for the ability to add capacitance in parallel with the ramp capacitors to decrease the pulse slew rate. This circuit accomplishes this function with the dual current design while adding only a minimal amount of parasitic capacitance to the ramp capacitors. For this invention, the parasitic capacitance should not be greater than 50 femtofarads.

Consider that initially the first ramp switch 332 and a range current switch 858 are closed and a range voltage switch 860 is open. The first ramp node 312 will be at a voltage potential of the high voltage reference source at the connection point 328. A first range diode 861 is connected in series with a second range diode 862. A third range diode 864 is connected in series with a fourth range diode 866. The anodes of the first range diode 861 and the third range diode 864 are connected to form a range node 871 which receives current from a first range current source 870. The first range current source 870 is set to supply 2IG of current. The cathode of the fourth range diode 866 is connected to the high voltage reference source at connection 328. The cathode of the second range diode 862 is connected to the first ramp node 312. With the switches in the initial position, the voltage across the two pairs of diodes will be equal, and therefore the current flowing through both pairs will be equal. The current (IG) being sourced to the first ramp node 312 through the second range diode 862 is removed from the first ramp node 312 by a range current sink 872. Therefore, no additional loading on the first ramp node 312 occurs at this time. A range capacitor 868 is charged to a voltage potential of one diode voltage drop above the voltage potential on the first ramp node 312. To generate the slew rate controlled rising edge of the pulse generator, the first ramp switch 332 and the range current switch 858 are opened and the range voltage switch 860 is closed. The range node 871 is set by the range voltage switch 860 to the potential of the high voltage reference source at connection point 330. The first range diode 861, the third range diode 864 and the fourth range diode 866 all become reversed biased and stop conducting current. The first current sink 313 will discharge both the first ramp capacitor 317 and the range capacitor 868. Therefore, the slew rate range has been greatly extended. In order to remove the range capacitor 868 from the circuit, the range voltage switch 860 is kept closed so that the range node 871 is kept at a voltage potential substantially equal to the low voltage reference source 330.

Figure 9:
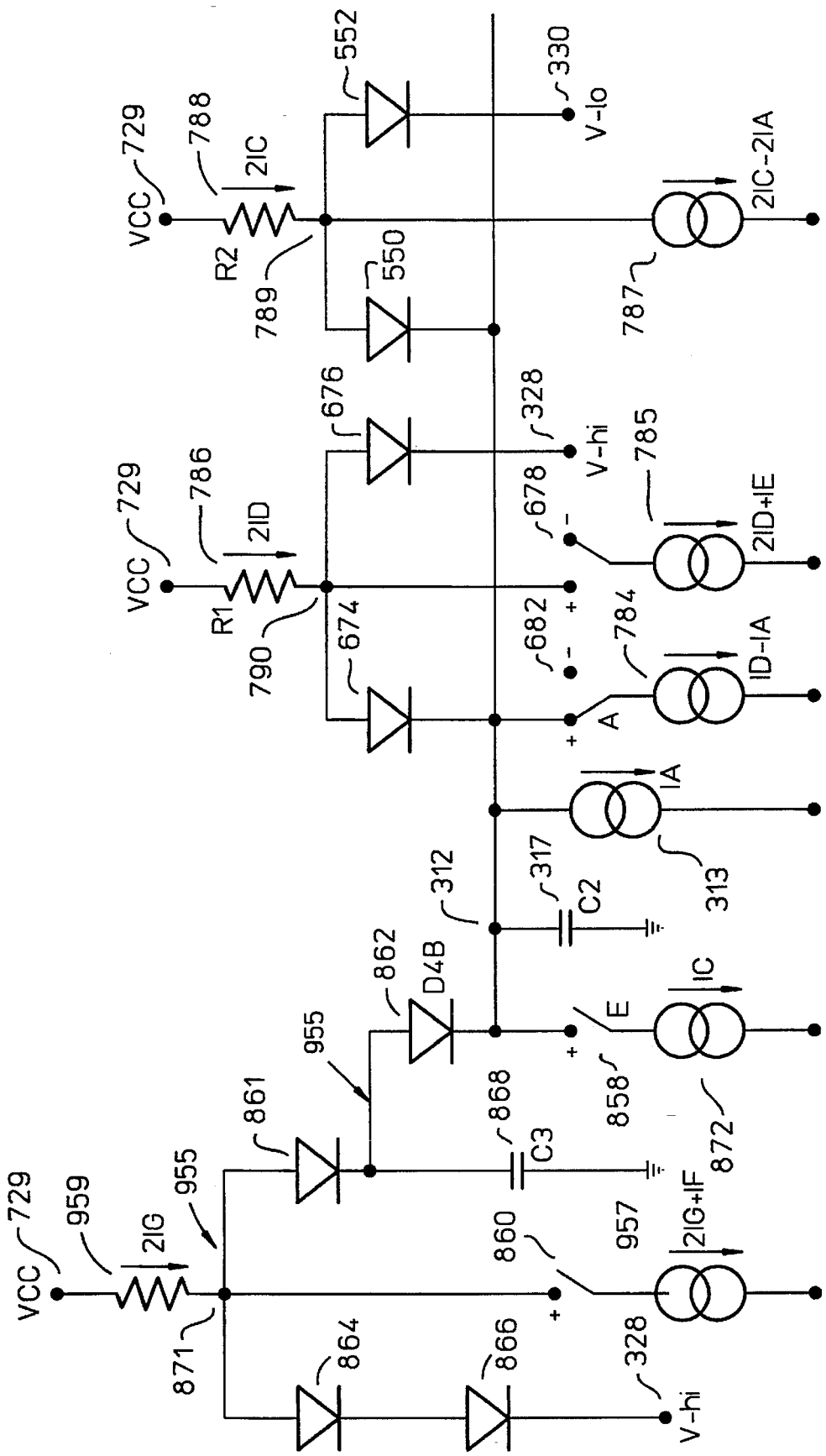
FIG. 9 is a circuit schematic of the clamping function of FIG. 7A and range change function of FIG. 8 combined.

FIG. 9 shows an embodiment of the invention wherein the ramp generator of FIG. 7A and range change circuitry of FIG. 8 have been combined. The split diode current supply 551 and the fourth ramp current source 675 have been replaced by resistors as was described earlier. A range resistor 959 replaces the first range current source 870. Again a replicate circuit produces the 2IG current which is mirrored through a current sink generator 957 and attached to the range voltage switch 960 along with an additional current of IF to produce an additional voltage change of about (high voltage reference source–low voltage reference source)+Vd at the range node 971. Where Vd is equal to a voltage drop across a forward biased diode so that the first range diode 861 will not conduct.

In the last half of a previous clock cycle, the first ramp current switch 682 and the range current switch 858 are closed and the range voltage switch 860 and the second ramp current switch 678 are open. This forces the first ramp node 312 to the potential of the high voltage reference source at connection point 328. When the clock switches to the first half of the clock cycle, the closed switches open and the opened switches close. The voltage on range node 871 and the voltage on first clamp node 790 drop in voltage by (high voltage reference source–low voltage reference source)+Vd (where Vd approximates the voltage across a forward biased diode). The voltage on a second range node 955 represents the potential across the range capacitor 868. The only sink current acting on the first ramp node 312 is IA. From the first ramp node 312 some of the first current sink 313 IA flows through the second range diode 862 to discharge the range capacitor 868. The first ramp capacitor 317 and the range capacitor 868 have effectively been paralleled and the first current sink 313 discharges the two capacitors with a current of IA for a slower slew rate. As the capacitors discharge, the first ramp node 312 and the second range node 955 decrease in potential until the voltage on the first ramp node 312 reaches the potential of the low voltage reference source at connection 330. When the clock switches to the second half of the clock cycle, the polarities of the switches 858, 860, 678, 682, are reversed, and the range node 871 and the first clamp node 790 return to their original voltage and the voltage on the first ramp node 312 returns quickly to the potential of the high voltage reference source at connection point 328.

Figure 10:
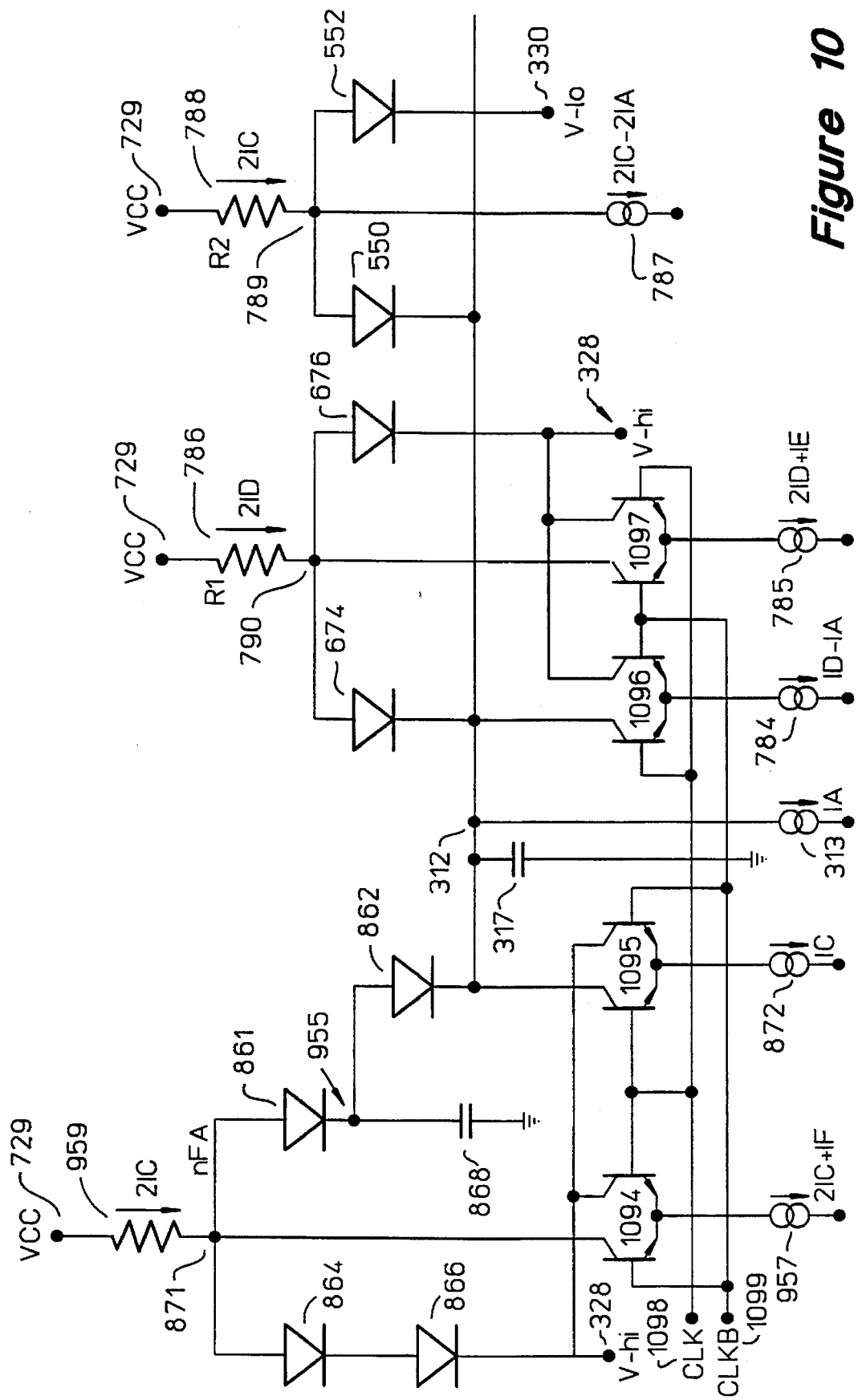
FIG. 10 is a schematic of an alternate embodiment of the clamping function and range change function of the invention combined.

An alternate embodiment of the first ramp generator 303 is shown in FIG. 10. This embodiment is similar to that shown in FIG. 9 and for convenience components in FIG. 10 that are similar to components in FIG. 9 are assigned the same reference numerals.

The embodiment of FIG. 10 shows the embodiment of FIG. 9 wherein the switches have been implemented by using NPN transistors configured in differential pairs 1094, 1095, 1096, 1097. The differential pairs can operate at high frequencies and are activated by the clock signal CLK 1098 and the inverted clock signal CLKB 1099. In an integrated circuit design, the diodes 550, 552, 861,864, 866, 868, 674, 676 can be replaced by either schottky diodes or base-emitter diodes of transistors. The advantage of base emitter diodes is that the base-emitter capacitance is very small due to the small emitter size and the associated parasitic capacitance to substrate is removed from the first ramp node 312. The typical voltage swing (high voltage reference source– low voltage reference source) is limited by the voltage allowed across one of these diodes.

Figure 11:
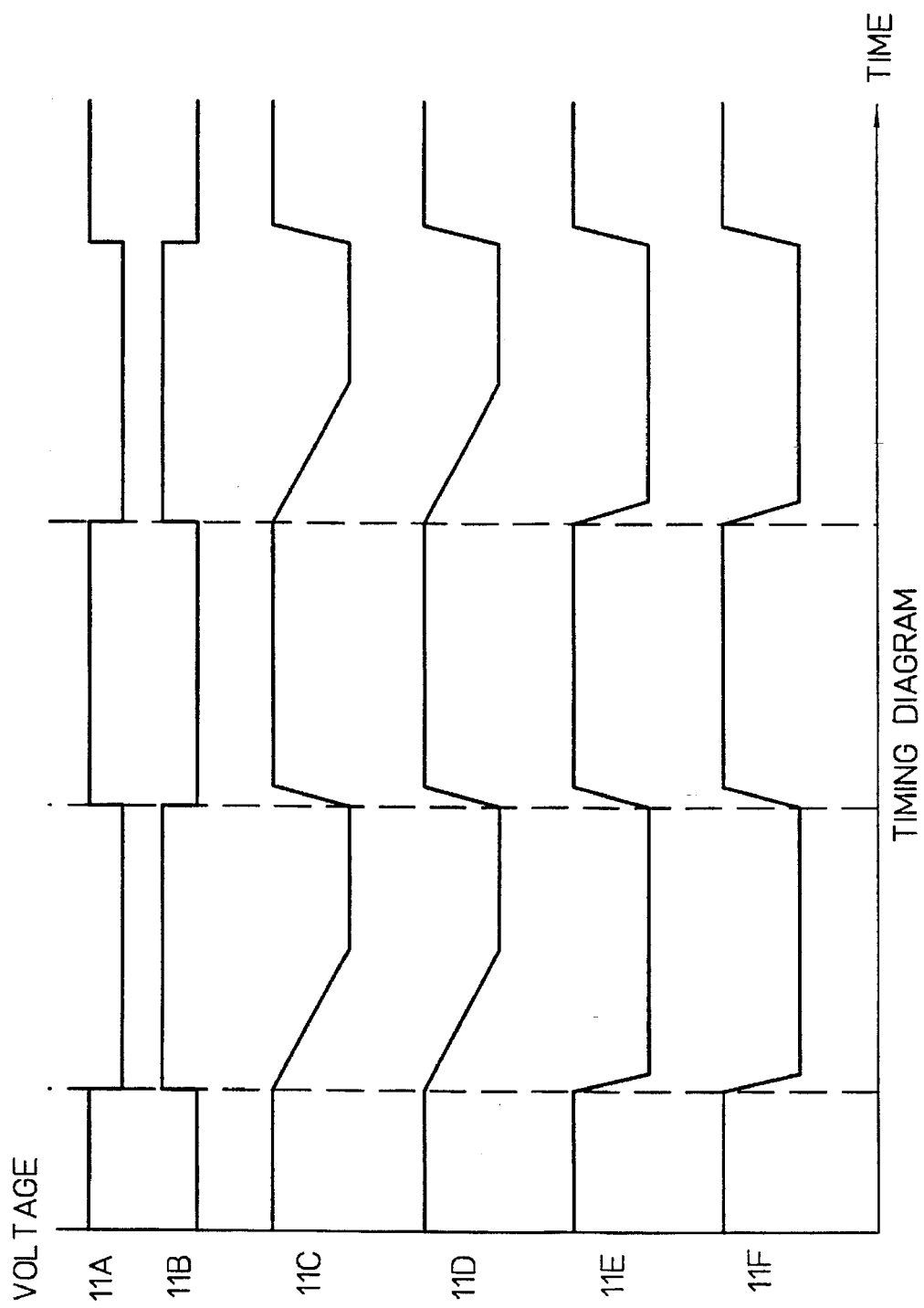
FIG. 11 shows traces 11A, 11B, 11C, 11D, 11E and 11F which are timing diagrams of the waveforms generated by the circuit shown in FIG. 10.

FIG. 11 shows traces 11A, 11B, 11C, 11D, 11E and 11F which depict the waveforms of the signals from FIG. 10. Trace 11A shows the clock signal 1098 and Trace 11B shows the inverted clock signal 1099. As was depicted in FIG. 10, the clock signals drive the differential pairs. Trace 11C shows the voltage signal on the first ramp node 312. Trace 11D shows the voltage signal on the second range node 955. Trace 11E shows the voltage signal on the range node 871. Trace 11F shows the voltage signal on the first clamp node 790.

Figure 12:
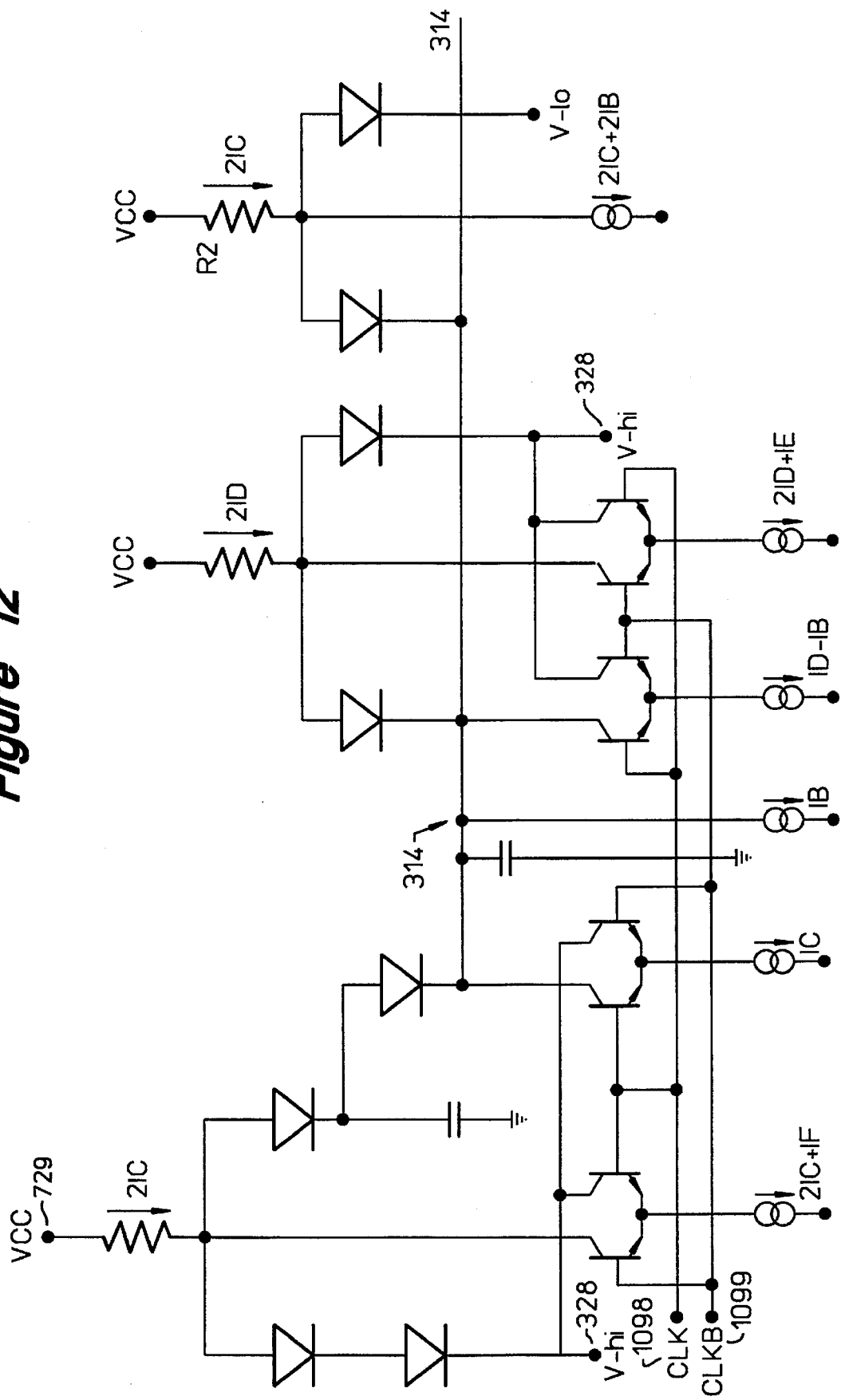
FIG. 12 is a schematic of the clamping function and range change function of the second ramp node.

FIG. 12 shows the range change and ramp generator circuitry for an embodiment of the second ramp generator 301. The only difference between the embodiment shown in FIG. 12 and the embodiment shown in FIG. 10, is the orientation of the CLK 1098 and CLKB 1099. All of the elements in FIG. 12 provide the same functionality as the elements of the first ramp generator 303 shown in FIG. 10.

Figure 13:
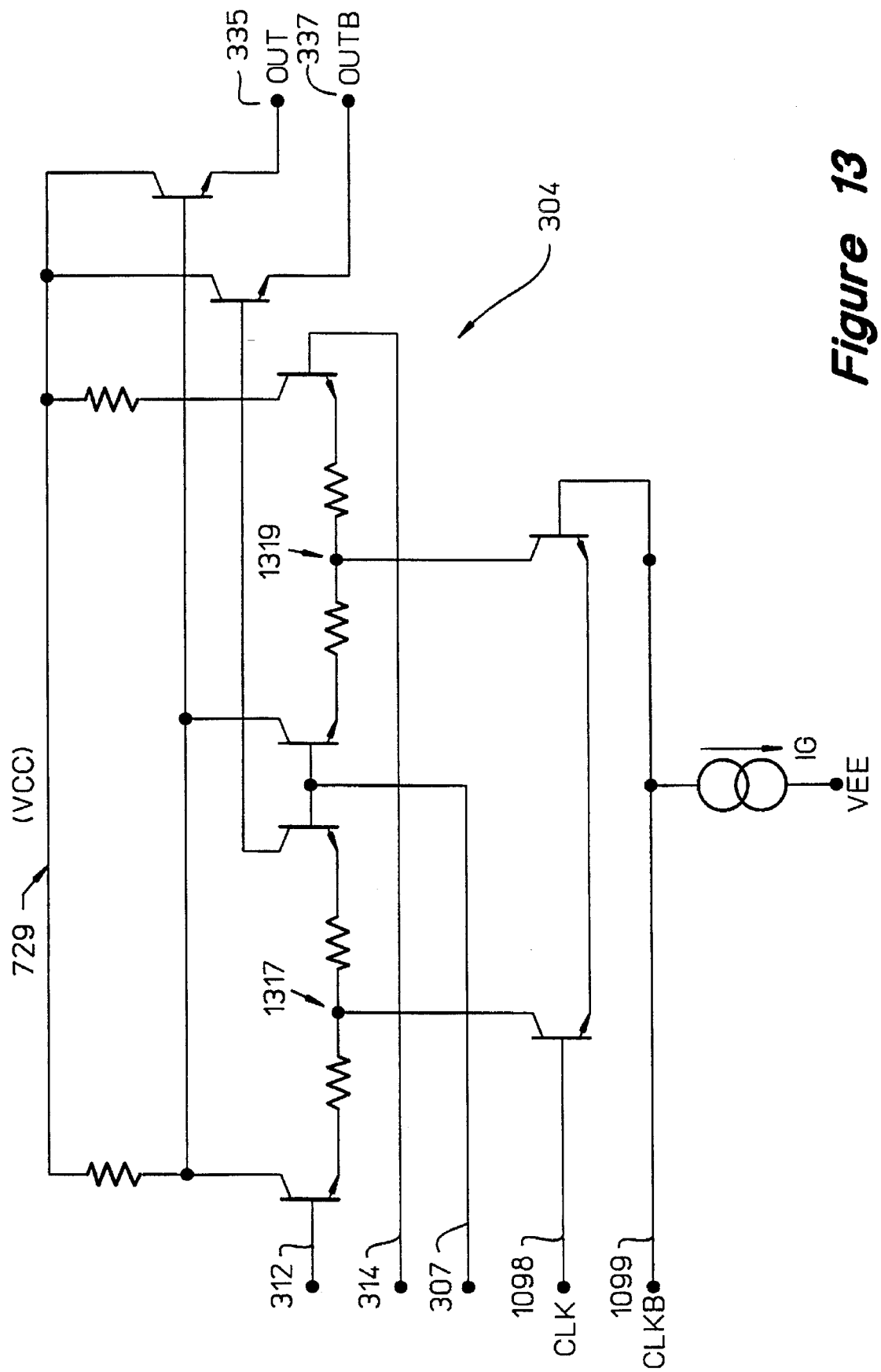
FIG. 13 is a circuit schematic of the vernier amplifier switch.

The first ramp node and the second ramp node are input to the vernier amplifier switch 304. A simplified diagram of the vernier amplifier switch 304 is shown in FIG. 13. The vernier amplifier switch 304 operates on the first ramp node 312 when the clock 1398 is in the first half of the clock cycle and operates on the second ramp node 314 when the clock 1398 is in the last half of the clock cycle. The first ramp node 312 and the second ramp node 314 node operate around a reference input 307 for each emitter degenerated differential pair 1317, 1319. Within a differential pair, one transistor goes from near completely on to near completely off, and the other transistor does the opposite as they transition through the current range. Both the reference voltage 307 and the sink current IG are controlled by additional circuitry and are proportional to the output amplitude of the drive buffer.

For high frequency operation (1 GHz), a high frequency package method must be used. The fabrication process used for the circuits of this invention is Bipolar, and uses very high frequency NPN transistors with cut-off frequencies ($f_T$) of 25 GHz. However, the invention may be implemented with a lower frequency process and still obtain desirable results. The process also incorporates low frequency PNP transistors to help in the DC control operations.

Although a specific embodiment of the invention has been described and illustrated, the invention is not to be limited to the specific forms or arrangements of parts so described and illustrated. The invention is only limited by the claims.

I claim:

1. An electronic integrated circuit variable slew rate pulse generator comprising:

a first ramp generator responsive to a clock signal and generating a first ramp signal, the first ramp signal ramping down at a first slew rate from a voltage level of V-hi to a voltage level of V-lo when the clock signal is in a first state;

a second ramp generator responsive to the clock signal and generating a second ramp signal, the second ramp signal ramping down at a second slew rate from a voltage level V-hi to a voltage level of V-lo when the clock signal is in a second state, the second slew rate adjustable independently from the first slew rate, and the first slew rate adjustable independently from the second slew rate; and a vernier amplifier switch for receiving the first ramp signal and the second ramp signal, the vernier amplifier switch generating an output signal having an amplitude and an offset, the output signal being an inverted function of the first ramp signal when the clock signal is in the first state, the output signal being a function of the second ramp signal when the clock signal is in the second state.

2. The slew rate pulse generator as described in claim 1, wherein the first ramp generator further comprises:

a first ramp capacitor having a first node and a second node, the first node connected to a ground terminal:

a first current sink conducting a predetermined amount of current from the second node;

means for coupling the second node to a ramp high voltage source when the clock signal is in the second state to charge the first ramp capacitor to the voltage level V-hi; and means for clamping the second node to a ramp low voltage so that the second node can not obtain a voltage lower than the V-lo;

such that when the clock is in the first state, the current sink conducts current from the first ramp capacitor discharging the first ramp capacitor so that the voltage on the second node declines at the first slew rate until the means for clamping prevents the voltage on the second node from going any lower.

3. The slew rate pulse generator as described in claim 2, wherein the means for clamping comprises a clamp diode.

4. The slew rate pulse generator as described in claim 2, wherein the means for clamping comprises a first clamping diode and a second clamping diode wherein the first clamping diode is matched to the second clamping diode.

5. The slew rate pulse generator as described in claim 4, wherein the cathode of the first clamping diode is connected to the second node, the cathode of the second clamping diode connected to the ramp low voltage source, the anode of the first clamping diode and the anode of the second clamping diode both being connected to a second current source such that when the first clamping diode conducts current the current conducted through the first clamping diode and the second clamping diode is substantially equal, thereby substantially matching the voltage drop across the first clamping diode to the voltage drop across the second clamping diode and clamping the second node voltage to the voltage potential of the ramp low voltage source.

6. The slew rate pulse generator as described in claim 4, wherein the means for connecting the second node to the ramp high voltage comprises a third ramp diode, a fourth ramp diode wherein the third ramp diode is matched to the fourth ramp diode.

7. The slew rate pulse generator as described in claim 6, further comprising a third ramp current sink, a fourth ramp current source, a first ramp current switch, a second ramp current switch, the anode of the third ramp diode being connected to the anode of the fourth ramp diode to form a ramp diode anode node, the fourth ramp current source supplying current to the ramp diode anode node, the cathode of the third ramp diode being connected to the second node, the cathode of the fourth ramp diode being connected to the ramp high voltage source, the second current ramp switch being connected to the ramp diode anode node and the ramp low voltage source, the first ramp current switch being connected to the second node and the third ramp current sink, such that when the clock signal is in the second state the second ramp current switch is open and the first ramp current switch is closed the third ramp diode and the fourth ramp diode conduct substantially the same amount of current forcing the second node to the voltage potential of the ramp high voltage source, and when the clock signal is in the first state the second ramp current switch is closed and the first ramp current switch is open forcing the third ramp diode and the fourth ramp diode to stop conducting.

8. The slew rate pulse generator as described in claim 2, wherein the first ramp generator further comprises:

means for switching a charged range capacitor to be connected in parallel with the first ramp capacitor so that the when the clock is in the first state the current sink conducts current from the range capacitor and the first ramp capacitor thereby decreasing the first slew rate and decreasing the rate the voltage on the second node declines.

9. The slew rate pulse generator as described in claim 8, wherein the means for switching comprises:

a first range diode, a second range diode, a third range diode and a fourth range diode, the cathode of the first range diode electrically connected to the ramp high voltage source, the anode of the first range diode connected to the cathode of the second range diode, the anode of the second range diode connected to a range node, the anode third range diode connected to the range node, the cathode of the third range diode connected to the anode of the fourth range diode, the cathode of the fourth range diode connected to the second node, the range capacitor connected between the cathode of the third range diode and the ground terminal;

a range voltage switch for electrically connecting the range node to the ramp low voltage source only when the clock is in the first state; and a range current switch for electrically connecting a current sink of a specified current to the second node only when the clock is in the second state;

such that when the clock is in the first state the first current sink discharges the ramp capacitor and the range capacitor, and when the clock is in the second state the ramp capacitor is charged up to the voltage level V-hi and the range capacitor is charged up to the voltage level of V-hi plus the voltage drop across a forward biased diode.

10. The slew rate pulse generator as described in claim 6, wherein the first ramp generator further comprises;

means for switching a charged range capacitor to be connected in parallel with the first ramp capacitor so that the when the clock is in the first state the current sink conducts current from the range capacitor and the first ramp capacitor thereby decreasing the first slew rate and decreasing the rate the voltage on the second node declines.

11. The slew rate pulse generator as described in claim 10, wherein the means for switching comprises;

a first range diode, a second range diode, a third range diode and a fourth range diode, the cathode of the first range diode electrically connected to the ramp high voltage source, the anode of the first range diode connected to the cathode of the second range diode, the anode of the second range diode connected to a range node, the anode third range diode connected to the range node, the cathode of the third range diode connected to the anode of the fourth range diode, the cathode of the fourth range diode connected to the second node, the range capacitor connected between the cathode of the third range diode and the ground terminal;

a range voltage switch for electrically connecting the range node to the ramp low voltage source only when the clock is in the first state; and a range current switch for electrically connecting a current sink of a specified current to the second node only when the clock is in the second state;

such that when the clock is in the first state the first current sink discharges the ramp capacitor and the range capacitor, and when the clock is in the second state the ramp capacitor is charged up to the voltage level V-hi and the range capacitor is charged up to the voltage level of V-hi plus the voltage drop across a forward biased diode.

12. The slew rate pulse generator as described in claim 1, wherein the vernier amplifier switch has a reference input for adjusting the offset of the output signal and an amplitude input for adjusting the amplitude of the output signal.

13. The slew rate pulse generator as described in claim 11, wherein all current sinks and current sources are implemented using NPN transistors.

14. The slew rate pulse generator as described in claim 11, wherein all diodes are implemented using the base-emitter junction of NPN transistors.

15. The slew rate pulse generator as described in claim 11, wherein all switches are implemented using NPN transistors.

16. A method of generating variable slew rate pulses on an electronic integrated circuit having a clock signal having a first state and a second state, the method comprising the steps of:

generating a first ramp signal, the first ramp signal ramping down at a first slew rate from a voltage level of V-hi to a voltage level of V-lo when the clock is in the first state;

generating a second ramp signal, the second ramp signal ramping down at a second slew rate from a voltage level of V-hi to a voltage level of V-lo when the clock is in the second state, the second ramp signal being independently adjustable from the first ramp signal; and generating an output signal that is an inverted function of the first ramp signal when the clock signal is in the first state and a function of the second ramp signal when the clock signal is in the second state.

\* \* \* \* \*

UNITED STATES PATENT AND TRADEMARK OFFICE
CERTIFICATE OF CORRECTION

PATENT NO. : 5,642,067
DATED : June 24, 1997
INVENTOR(S) : James W. Grace

It is certified that error appears in the above-indentified patent and that said Letters Patent is hereby corrected as shown below:

Column 2, Line 31, "cream" should read -- create --;

Column 5, Line 17, "failing" should read -- falling --;

Column 5, Line 17, "con" should read -- controlled edges which are --;

Signed and Sealed this

Thirteenth Day of January, 1998

Attest:

BRUCE LEHMAN

*Attesting Officer*    *Commissioner of Patents and Trademarks*